(12) United States Patent
Chawla et al.

(10) Patent No.: US 12,292,780 B2
(45) Date of Patent: *May 6, 2025

(54) COMPUTING SYSTEM POWER MANAGEMENT DEVICE, SYSTEM AND METHOD

(71) Applicants: STMICROELECTRONICS S.r.l., Agrate Brianza (IT); STMicroelectronics International N.V., Geneva (CH)

(72) Inventors: Nitin Chawla, Noida (IN); Anuj Grover, New Delhi (IN); Giuseppe Desoli, San Fermo Della Battaglia (IT); Kedar Janardan Dhori, Ghaziabad (IN); Thomas Boesch, Rovio (CH); Promod Kumar, Greater Noida (IN)

(73) Assignees: STMICROELECTRONICS S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/338,950

(22) Filed: Jun. 21, 2023

(65) Prior Publication Data
US 2023/0350483 A1    Nov. 2, 2023

Related U.S. Application Data

(63) Continuation of application No. 17/111,373, filed on Dec. 3, 2020, now Pat. No. 11,726,543.
(Continued)

(51) Int. Cl.
*G06F 1/3287* (2019.01)
*G05F 3/24* (2006.01)
(Continued)

(52) U.S. Cl.
CPC .............. *G06F 1/3275* (2013.01); *G05F 3/24* (2013.01); *G06F 1/3287* (2013.01); *G06F 15/7821* (2013.01); *G11C 11/413* (2013.01)

(58) Field of Classification Search
CPC ........ G06F 1/3275; G06F 3/24; G06F 1/3287; G11C 11/1413
See application file for complete search history.

(56) References Cited

U.S. PATENT DOCUMENTS 7,307,907 B2    12/2007  Houston
7,486,572 B2    2/2009   Luo et al.
(Continued)

FOREIGN PATENT DOCUMENTS

| CN | 102844817 A | 12/2012 |
| CN | 214504409 U | 10/2021 |
| JP | 2019046374 A | 3/2019 |

*Primary Examiner* — Jaweed A Abbaszadeh
*Assistant Examiner* — Brynne J. Corcoran
(74) *Attorney, Agent, or Firm* — Seed IP Law Group LLP

(57) ABSTRACT

Systems and devices are provided to enable granular control over a retention or active state of each of a plurality of memory circuits, such as a plurality of memory cell arrays, within a memory. Each respective memory array of the plurality of memory arrays is coupled to a respective ballast driver and a respective active memory signal switch for the respective memory array. One or more voltage regulators are coupled to a ballast driver gate node and to a bias node of at least one of the respective memory arrays. In operation, the respective active memory signal switch for a respective memory array causes the respective memory array to transition between an active state for the respective memory array and a retention state for the respective memory array.

14 Claims, 11 Drawing Sheets

Related U.S. Application Data

(60) Provisional application No. 62/947,815, filed on Dec. 13, 2019.

(51) Int. Cl.
 G06F 1/3234 (2019.01)
 G06F 15/78 (2006.01)
 G11C 11/413 (2006.01)

(56) References Cited

U.S. PATENT DOCUMENTS

| | | | |
|---|---|---|---|
| 8,320,210 B2 | 11/2012 | Narayanaswamy et al. | |
| 9,001,570 B1 | 4/2015 | Sachan et al. | |
| 9,471,121 B2 | 10/2016 | Saha et al. | |
| 9,607,692 B2 * | 3/2017 | Tang | G11C 11/5642 |
| 9,620,200 B1 | 4/2017 | Mangal et al. | |
| 10,579,083 B1 | 3/2020 | Gonapati et al. | |
| 2006/0098474 A1 | 5/2006 | Dang et al. | |
| 2006/0268628 A1 | 11/2006 | Hirabayashi | |
| 2007/0211545 A1 | 9/2007 | Otsuka et al. | |
| 2007/0280009 A1 | 12/2007 | Otsuka et al. | |
| 2009/0052246 A1 * | 2/2009 | Bertin | G11C 13/0002 365/151 |
| 2010/0238001 A1 | 9/2010 | Veskovic | |
| 2011/0261609 A1 | 10/2011 | Seshadri | |
| 2012/0230126 A1 | 9/2012 | Ramaraju et al. | |
| 2014/0075089 A1 * | 3/2014 | Bartling | G06F 3/0688 711/102 |
| 2014/0201553 A1 * | 7/2014 | Dressler | G06F 1/28 713/324 |
| 2016/0011651 A1 | 1/2016 | Nychka et al. | |
| 2019/0164595 A1 * | 5/2019 | Kim | G06F 11/1068 |
| 2020/0103956 A1 * | 4/2020 | Srinivas | G06F 3/0683 |
| 2020/0227477 A1 | 7/2020 | Majhi et al. | |

* cited by examiner

COMPUTING SYSTEM POWER MANAGEMENT DEVICE, SYSTEM AND METHOD

BACKGROUND

Technical Field

The present disclosure generally relates to digital logic power management. More particularly, but not exclusively, the present disclosure relates to the configuration and efficient operation of computing systems and components in disparate power states.

Description of the Related Art

Advanced systems on a chip (SoCs) may include relatively large memory arrays of on-chip Static Random Access Memory (SRAM), with such SRAM memory arrays being associated with high power requirements when active (while being accessed). During low load conditions, large parts of such SRAM memory arrays may be placed in a low power condition termed retention, in which the data content of each memory array is retained without requiring the corresponding memory array to quickly respond to memory access requests. By reducing the voltage applied to the relevant SRAM memory array during retention, leakage current associated with the relevant SRAM memory array may be significantly reduced.

BRIEF SUMMARY

Typical solutions for tracking and/or managing retention voltages of digital logic circuits, such as SRAM memory arrays, have resulted in various degrees of inefficiency in high leakage conditions to maintain margins necessary to compensate for (or otherwise associated with) circuit manufacturing variations.

Systems and devices are provided to enable granular control over a retention or active state of each of a plurality of digital logic circuits, such as a plurality of memory cell arrays. For example, in an embodiment each respective digital circuit of the plurality of digital circuits is coupled to a respective ballast driver and a respective active signal switch for the respective digital circuit. One or more voltage regulators are coupled to the plurality of digital circuits via a bias node of at least one of the respective digital circuits. In operation, the respective active signal switch for a respective digital circuit causes the respective digital circuit to transition between an active state for the respective digital circuit and a retention state for the respective digital circuit.

DETAILED DESCRIPTION

Figure 1:
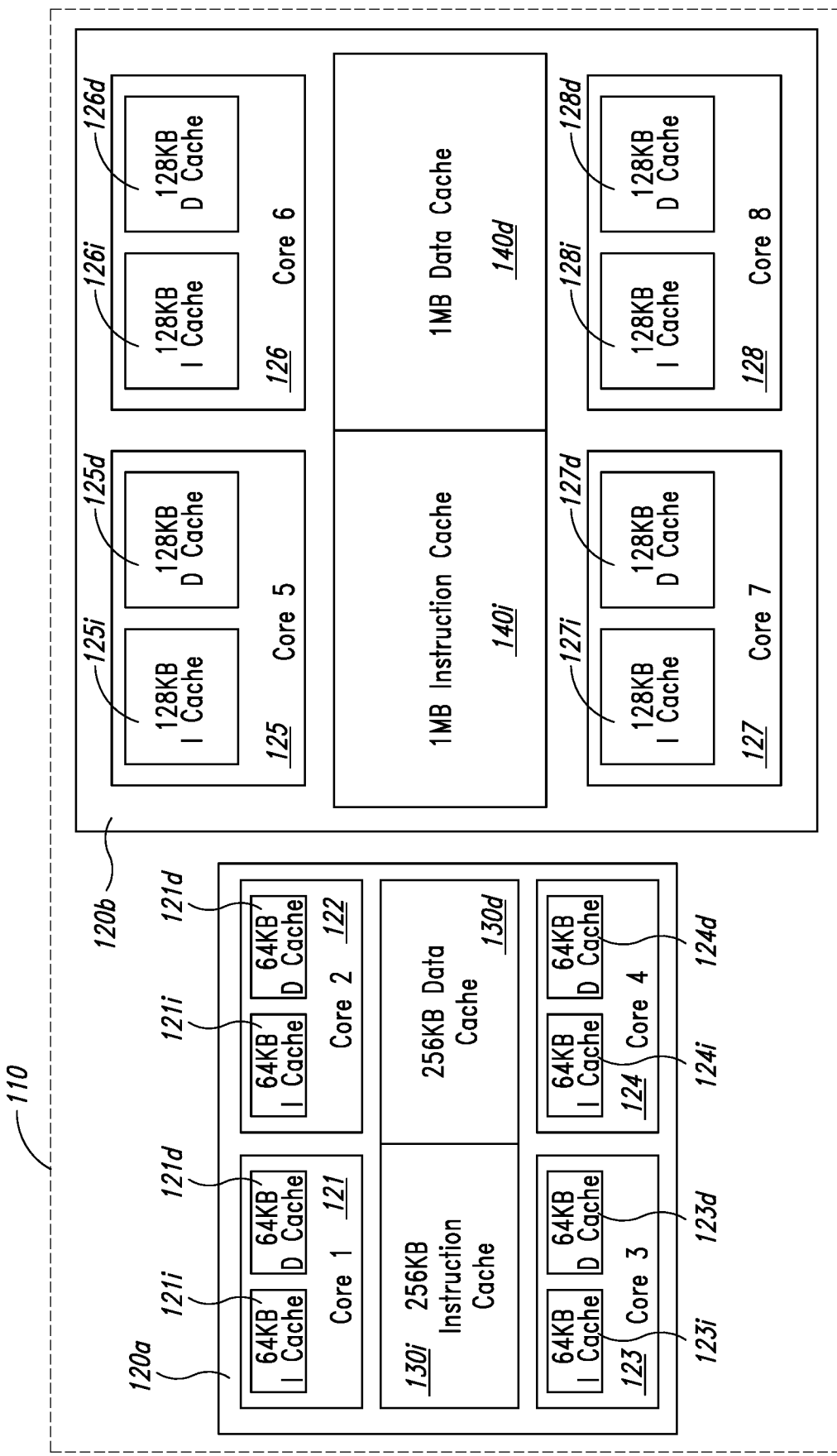
FIG. 1 is a block diagram of an exemplary configuration of Static Random Access Memory (SRAM) included within a multi-processor computing system.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, circuits, such as transistors, integrated circuits, logic gates, memories, interfaces, bus systems, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to." Reference to "at least one of" shall be construed to mean either or both the disjunctive and the inclusive, unless the context indicates otherwise.

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

It will be appreciated that although descriptions of various techniques presented herein largely cite examples involving memory cell arrays (such as SRAM memory arrays), such techniques may be applicable to a variety of memory circuits, and indeed to a variety of other digital logic circuits, in which multiple power states may be maintained and/or otherwise utilized. For example, state machines or other digital circuits which employ one or more flip-flops to retain data may employ one or more of the techniques described herein, systems which employ multiple digital logic circuits maintained in different power states (e.g., power states associated with various operational modes, active state, standby state, self-test state, etc.) may employ one or more of the techniques disclosed herein, etc.

FIG. 1 depicts an exemplary configuration of SRAM included within a multi-processor SoC 110, in which the SRAM is comprised of multiple disparately sized arrays of memory cells. As used herein, the terms memory array and memory cell array are used interchangeably. A memory array is organized as a plurality of rows and columns. In the depicted configuration, a first multiple-core processor 120a includes four distinct processing cores (respectively identified as Core1 121, Core2 122, Core3 123, and Core4 124), each having a 64 KB instruction cache and a 64 KB data cache. In particular, Core1 121 is associated with instruction cache 121i and data cache 121d; Core2 122 is associated with instruction cache 122i and data cache 122d; Core3 123 is associated with instruction cache 123i and data cache 123d; and Core4 124 is associated with instruction cache 124i and data cache 124d. In addition, the multiple-core processor 120a includes a shared 256 KB instruction cache 130i and a shared 256 KB data cache 130d, both of which are shared for use by each of Core1, Core2, Core3, and Core4.

Similarly, also in the depicted configuration of FIG. 1, a second multiple-core processor 120b includes an additional four distinct processing cores (respectively identified as Core5 125, Core6 126, Core7 127, and Core8 128), each having a 128 KB instruction cache and a 128 KB data cache. In particular, Core5 125 is associated with instruction cache 125i and data cache 125d; Core6 126 is associated with instruction cache 126i and data cache 126d; Core7 127 is associated with instruction cache 127i and data cache 127d; and Core8 128 is associated with instruction cache 128i and data cache 128d. In addition, the processor 120b includes a shared 1 MB instruction cache 140i and a shared 1 MB data cache 140d, both of which are shared for use by each of Core5, Core6, Core7, and Core8.

Thus, in total the SoC 110 includes eight 64 KB SRAM memory arrays, eight 128 KB SRAM memory arrays, two 256 KB SRAM memory arrays, and two 1 MB SRAM memory arrays for use by a total of eight distinct processing cores between the two multi-core processors 120a and 120b. It will be appreciated that the SoC 110 may comprise additional components (e.g., one or more graphical processing units, graphics and/or memory interfaces, I/O interfaces, secondary storage components, analog and/or digital signal processing components, etc.) that are not shown for purposes of clarity.

Figure 2:
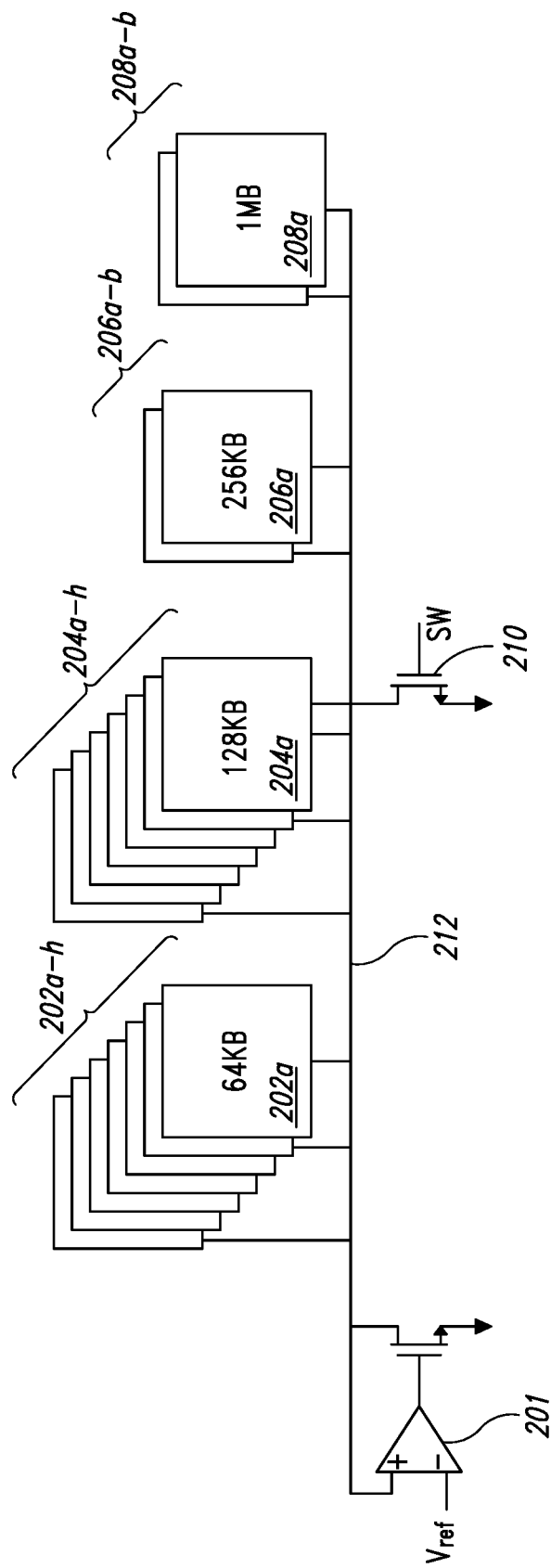
FIG. 2 depicts a known SRAM configuration comprising a coupled plurality of disparately sized memory arrays.

Within SoC configurations such as that depicted in FIG. 2, each of multiple disparately sized memory arrays may share a common bias node. In the depicted configuration, a single voltage regulator 201 is coupled via a common bias node 212 to all of a plurality of multiple memory arrays (in particular, eight 64 KB memory arrays 202a-h, eight 128 KB memory arrays 204a-h, two 256 KB memory arrays 206a-b, and two 1 MB memory arrays 208a-b), and provides current to all of those multiple memory arrays while such memory arrays are in a state of retention. When an active memory signal SW is switched high via memory activation switch 210 to take such memory arrays out of retention, the common bias node 212 is pulled to ground, increasing the current through all of the memory arrays and preparing those memory arrays for active access. However, the feedback provided to regulator 201 via the common bias node 212 is thereby disrupted. As the active memory signal SW transitions from high to low, the regulator must quickly return to operation, requiring a high bandwidth loop. Because the output of the single regulator 201 does not compensate for variations in process, operating voltage, and temperature, the memory cells of memory arrays 204, the regulator 201 and the switch 210 typically are over designed in order to operate under the worst possible conditions. In addition, it will be appreciated that in the configuration of FIG. 2, individual memory arrays may not enter into a retention state; instead, all of the coupled memory arrays are either in retention or in an active state, as determined by the active memory signal SW via memory activation switch 210.

Figure 3A:
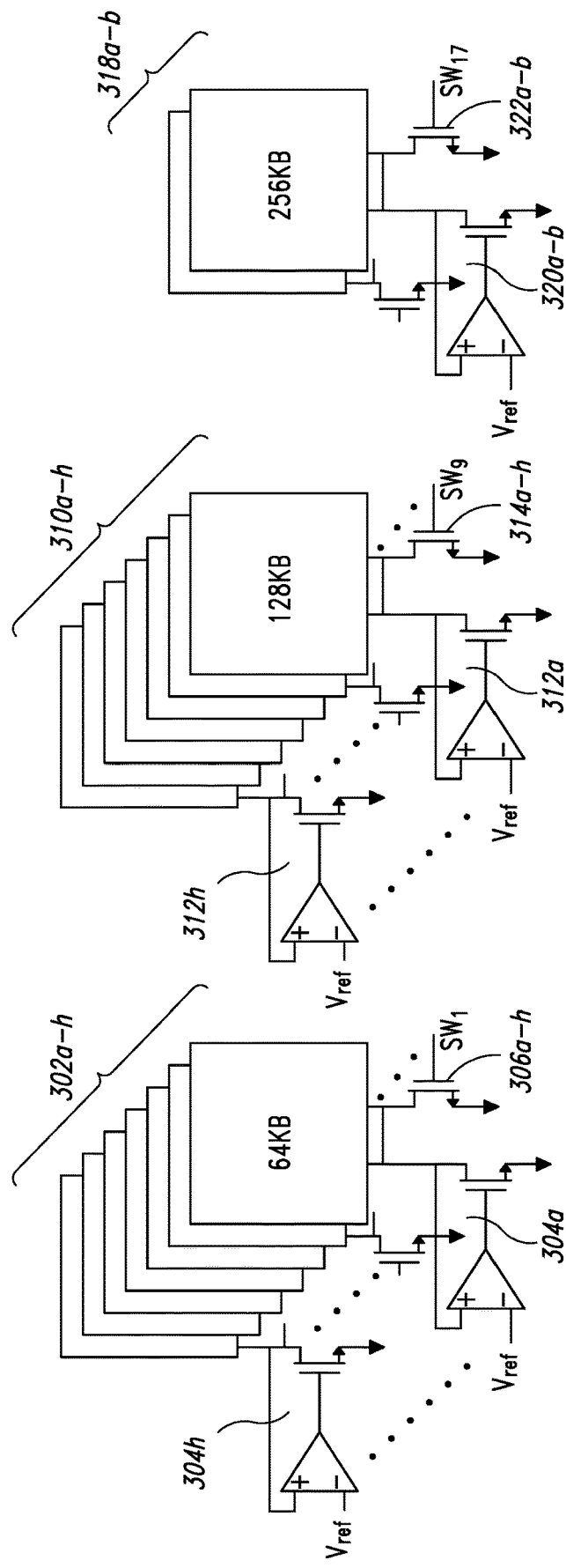
FIGS. 3A and 3B illustrate an embodiment of a coupled plurality of disparately sized memory arrays in accordance with techniques described herein.
Figure 3B:
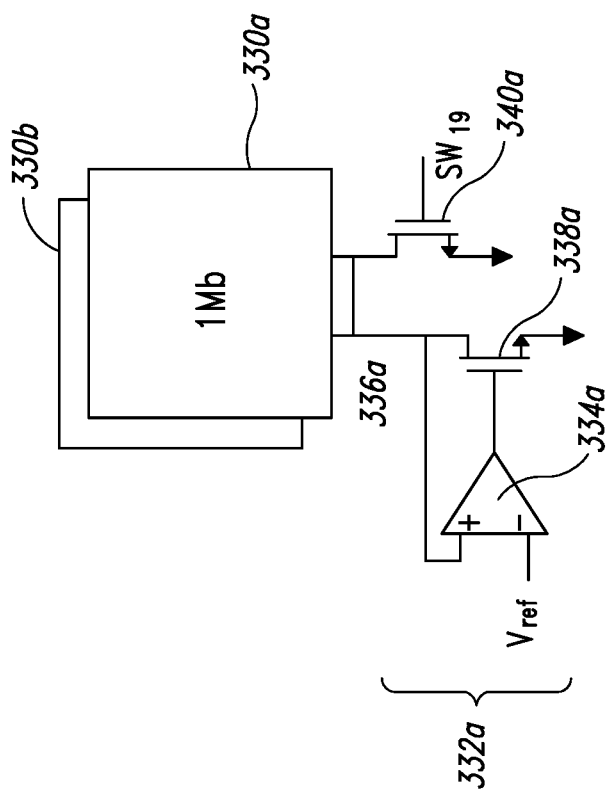

FIGS. 3A and 3B present a partial schematic diagram in accordance with an embodiment of techniques described herein, in which each of a plurality of twenty disparately sized memory cell arrays (eight 64 KB memory arrays 302a-h, eight 128 KB memory arrays 310a-h, two 256 KB memory arrays 318a-b, and two 1 MB memory arrays 330a-b) is coupled to its own respective voltage regulator 334 having an input coupled to a bias node for the respective memory array and an output coupled a respective gate node of a respective ballast driver 338. In at least the depicted embodiment, the voltage regulator 338 may be a low dropout regulator (LDO), a linear voltage regulator designed to operate with a very low input-to-output voltage differential (dropout voltage) in order to minimize the power dissipated as heat on the device. Compared to DC-DC switching converters, LDO regulators typically do not generate ripple as a result of the small number of external passive components needed. In the depicted embodiment, the respective voltage regulators facilitate maintaining high area efficiency over a wide range of loading conditions, offering increased granularity of small memory array wake-up and retention by controlling distributed ballast in each of those memory arrays. Such an embodiment enables retention till access with highly efficient current leakage recovery.

In the depicted embodiment, the eight 64 KB memory arrays 302a-h are each coupled to a respective LDO 304a-h and an active memory signal switch 306a-h, which control entry and exit from retention for each corresponding coupled memory array. Each of the eight 128 KB memory arrays 310a-h is similarly coupled to a respective LDO 312a-h, as well as a respective active memory signal switch 314a-h. In a similar manner, each of the two 256 KB memory arrays 318a-b is coupled to a respective LDO 320a-b, as well as a respective active memory signal switch 322a-b; each of the two 1 MB memory arrays 330a-b is coupled to a respective LDO 332a-b, as well as a respective active memory signal switch 338a-b. In notable contrast to the configuration of FIG. 2 (in which a single signal SW activates or places into retention all or none of memory arrays 202a-h, 204a-h, 206a-b, and 208a-b), it will be appreciated that each of the memory arrays or instances of the depicted embodiment may be individually activated or placed in retention via its corresponding active memory signal switch.

FIG. 3B provides a more granular schematic view of the LDO structure 332a coupled to 1 MB memory array 330a. Entry and exit from retention for the memory array 330a is controlled by active memory signal $sw_{19}$ via switch 340a. The memory array 330a is coupled to LDO structure 332a, which comprises a differential amplifier 334a coupled between a bias node 336a and ballast driver 338a. While a second 1 MB memory array 308b is also depicted, the corresponding LDO structure coupled to memory array 308b is omitted for clarity. It will be appreciated that in the embodiment, a second LDO structure 332b is coupled to the second 1 MB memory array 330b, and that each of the corresponding LDO structures 304a-h, 312a-h, and 320a-b (respectively coupled to the individual memory arrays 302a-h, 310a-h, and 318a-b) includes a structure and components similar to those depicted with respect to LDO structure 332a. Each memory instance has a small ballast driver (e.g., ballast driver 338a). As the size of the memory instance increases, the size of the coupled ballast driver transistor also increases. Small instances have small drivers, which facilitates avoiding area loss due to over-design.

Figure 4:
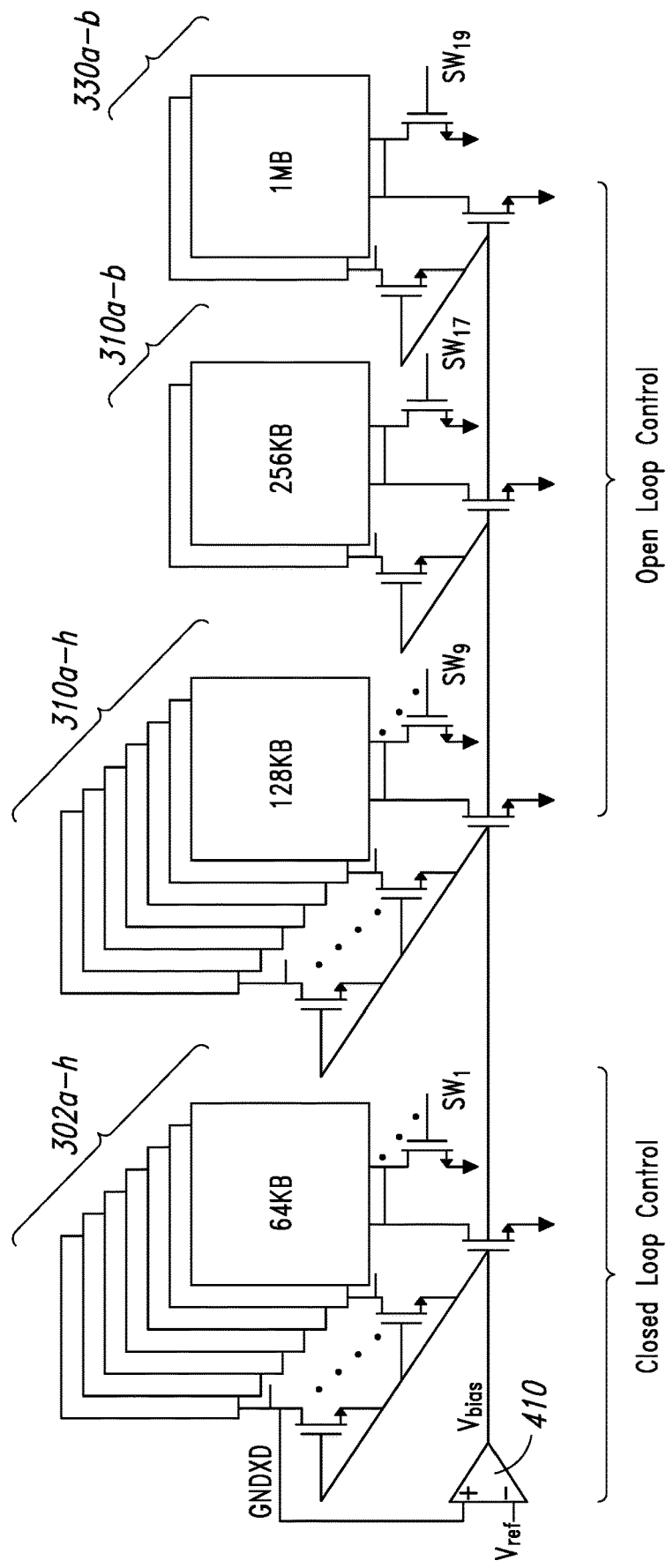
FIG. 4 illustrates an additional embodiment of a coupled plurality of disparately sized memory arrays in accordance with techniques described herein.

In an additional embodiment illustrated by FIG. 4, a small ballast driver is respectively coupled to each of the memory arrays 302a-h, 310a-b, 318a-b, and 330a-b, and driven by a common low power differential amplifier 410. In contrast to the embodiment depicted in FIG. 3, a separate respective LDO structure (comprising a separate differential amplifier as well as the respective ballast driver) is not coupled to each memory array, and therefore the embodiment of FIG. 4 may achieve significant area savings while maintaining the ability to selectively determine which individual memory arrays enter a retention state. In the embodiment, one cluster of memory arrays (e.g., a group of memory arrays, such as 64 KB memory arrays 302) is assumed to enter into retention prior to other instances, and may therefore operate as a reference generator to produce $V_{bias}$ for the other clusters. For ease of illustration, the cluster of memory arrays assumed to enter into the retention state before the other memory arrays as shown is memory array 302. However, is some embodiments a different memory array may be assumed to enter into the retention mode prior to the other memory arrays, such as memory array 310. If memory array 310 enters into the retention mode prior to any block it acts as the $V_{bias}$ reference generator as no other block is in retention yet. In some embodiments, when a first memory array of a plurality of memory arrays enters into a retention stage (e.g., memory array 302, 310, 318 or 330), switches may be provided to couple a bias node of that memory array (see switches 624, 626 of FIG. 6) to the ballast driver to provide a reference voltage. Delay circuits may be employed (see delay block 710 of FIG. 7) to stagger the timing of the entry of memory arrays into a retention mode.

As depicted, the embodiment of FIG. 4 may be considered to provide a mixture of closed loop control (such as with respect to 64 KB memory arrays 302 and the differential amplifier 410) to regulate $V_{bias}$, and open loop control (such as with respect to differential amplifier 410 in conjunction with 128 KB memory arrays 310a-h, 256 KB memory arrays 318a-b, and/or 1 MB memory arrays 330a-b). Typically, a differential amplifier having a high operational bandwidth is employed to accommodate rapid changes in the amount of memory in retention mode.

Figure 5:
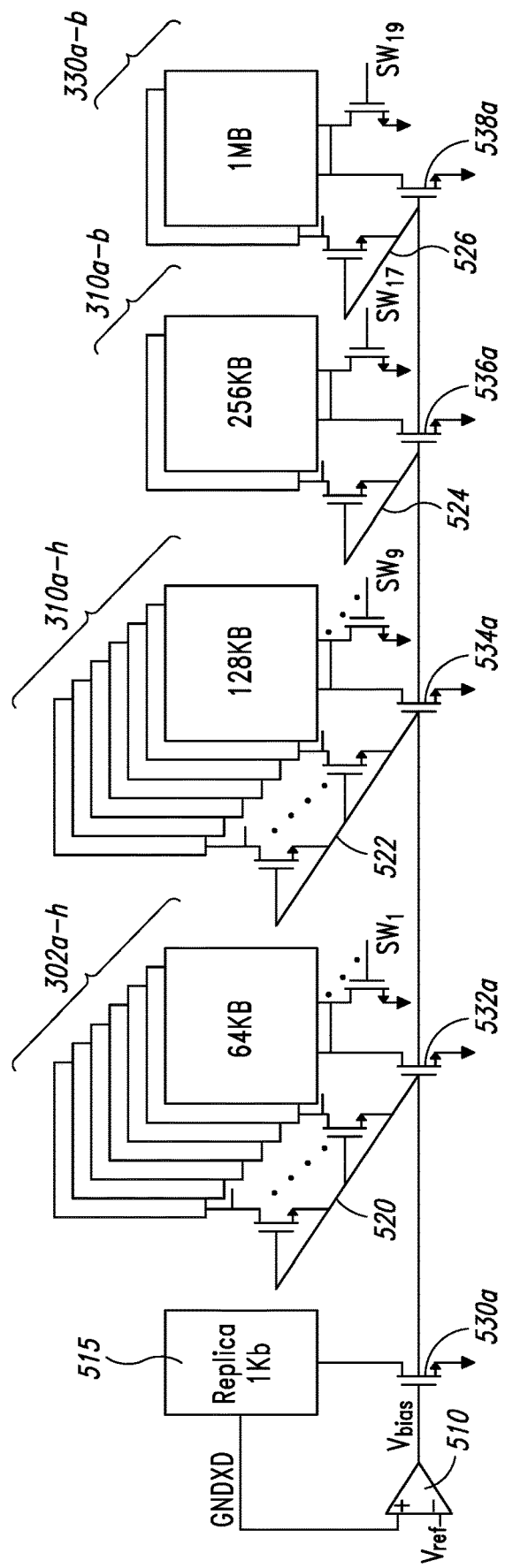
FIG. 5 illustrates an additional embodiment of a coupled plurality of disparately sized memory arrays in accordance with techniques described herein.

In an additional embodiment illustrated by FIG. 5, the plurality of memory arrays additionally includes a 1 Kb replica memory array 515 coupled to a differential amplifier 510. The replica memory array 515 may be a small memory array having a topology similar or identical to the larger memory arrays coupled to the differential amplifier 510, and may be utilized in order to maintain the LDO in an active state while maintaining the bias node voltage $V_{bias}$ at a voltage that is close to the desired reference voltage for the distributed ballast driver. The replica array 515 operates in a closed loop, providing a gate bias to the distributed ballast and setting the bias voltage for those memory arrays that are operating in open loop mode (memory arrays 302, 310, 318, and 330). As in the embodiments of FIGS. 3-4, entry and exit from retention for each respective memory array is controlled by the corresponding active memory signals $sw_{1-20}$. In at least the depicted embodiment, in which the source bias NMOS transistors 530a, 532a, 534a, 536a, and 538a are controlled via $V_{bias}$ and in which the topology of the replica memory array 515 may be substantially identical to that of the additional memory arrays 302a-h, 310a-h, 318a-b, and 330a-b, the voltages at the indicated nodes 520, 522, 524 and 526 may be maintained as substantially equal to the indicated GNDXD voltage at the input of differential amplifier 510 while the replica memory array 515 is in retention. This facilitates using differential amplifiers having lower operational bandwidths.

Figure 6:
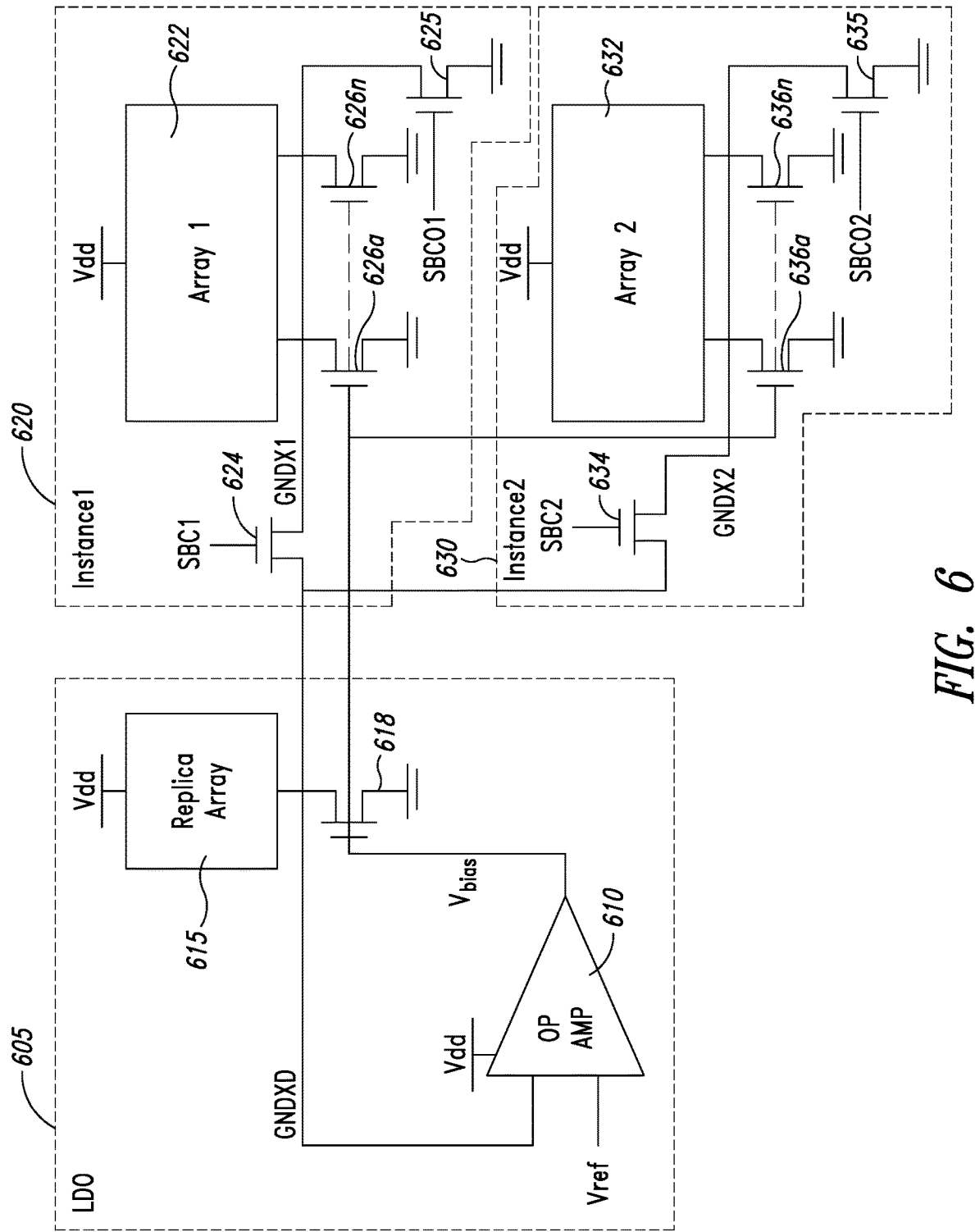
FIG. 6 illustrates an additional embodiment of a coupled plurality of disparately sized memory arrays in accordance with techniques described herein.

In an additional embodiment illustrated by FIG. 6, a replica memory array 615 operates in the closed loop of an LDO structure 605, the bias node of the replica array 615 is coupled to a common bias node or line GNDXD. The LDO structure 605 is coupled to two memory instances, as illustrated SRAM instances 620 and 630. The SRAM instance 620 includes a first memory array 622, as well as distributed ballast drivers 626a to 626n; SRAM instance 630 includes a second memory array 632, as well as distributed ballast drivers 636a to 636n. Each column of the memory arrays 622 and 632 may have a corresponding distributed ballast driver 626i, 636i respectively. The distributed ballast drivers 626i, 636i of non-replica memory cell arrays 622 and 632 are included in the closed loop of the LDO structure 605 while those memory cell arrays are in retention. Feedback transistor switches 624 and 634 are respectively coupled between the common bias node or line GNDXD of the LDO structure 605 and the respective bias nodes or lines GNDX1, GNDX2 of each non-replica memory cell array 622 and 632; in the embodiment, the feedback transistor switches provide greater control of the feedback loop for LDO structure 605 by allowing physical shorting of bias node GNDXD and respectively each of bias nodes GNDX1 and GNDX2. With respect to SRAM instance 620, the feedback transistor switch 624 is closed when the source bias control SBC1 goes high and source bias control off SBCO1 goes low, placing the memory array 622 into retention. Conversely, when source bias control off SBCO1 goes high (readying memory array 622 for active access), SBC1 goes low, opening the feedback transistor switch 624 until the memory array 622 is once again in retention. The states of SBC1 and SBCO1 typically would be controlled so as to avoid closing both switch 624 and 625 at the same time, in order to avoid disturbance of feedback within LDO structure 605. In a similar manner, with respect to SRAM instance 630, the feedback transistor switch 634 is closed when the source bias control SBC2 goes high and source bias control off SBCO2 goes low, placing the memory array 632 into retention. Conversely, when source bias control off SBCO2 goes high (readying memory array 632 for active access), SBC2 goes low, opening the feedback transistor switch 634 until the memory array 632 is once again in retention. Once again, the states of SBC2 and SBCO2 typically would be controlled so as to avoid closing both switch 624 and 625 at the same time, in order to avoid disturbance of feedback within the coupled LDO structure 605.

Figure 7:
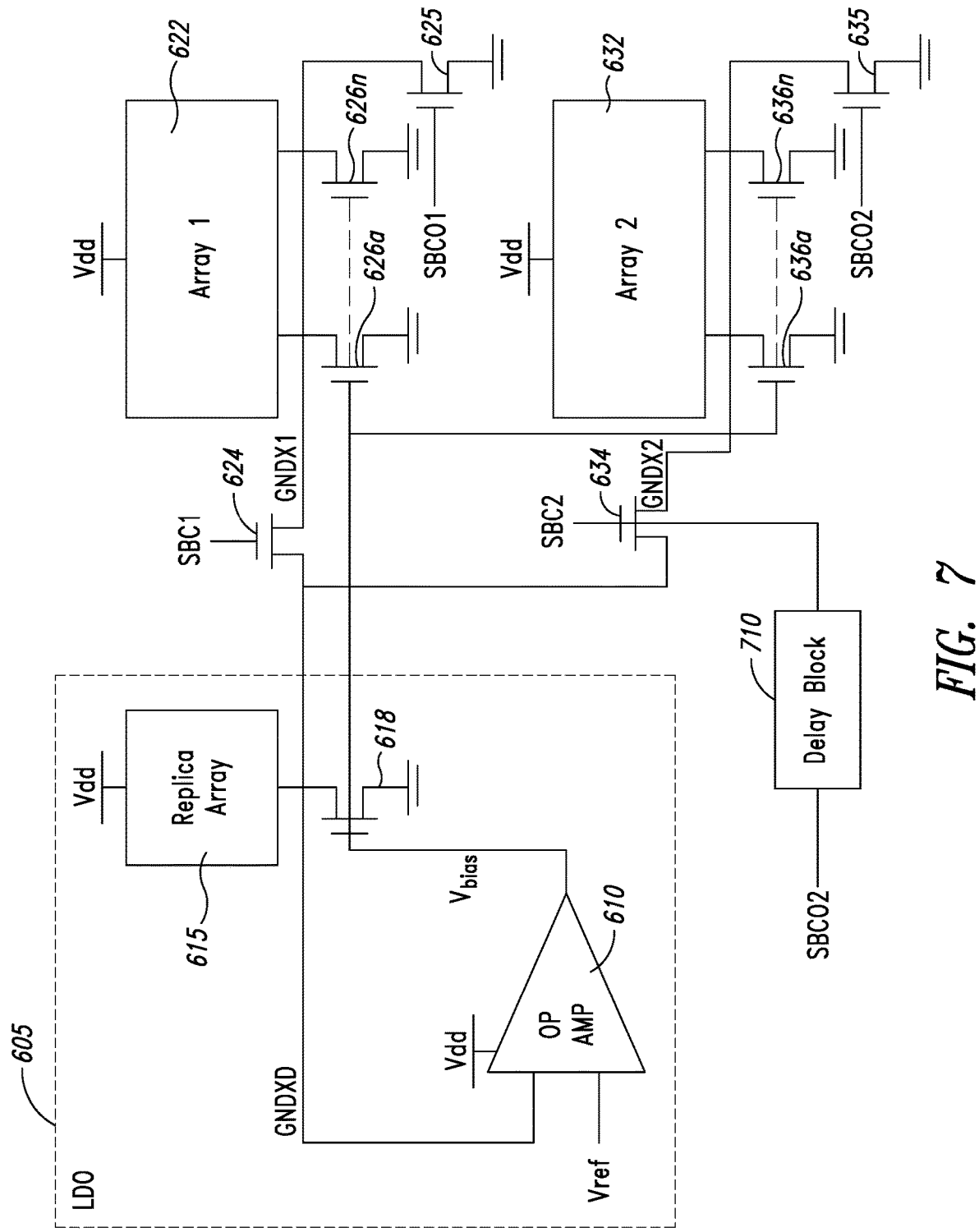
FIG. 7 illustrates an additional embodiment of a coupled plurality of disparately sized memory arrays in accordance with techniques described herein.

In an additional embodiment illustrated by FIG. 7, the embodiment of FIG. 6 has been modified to include an optional delay circuitry block 710 in series with the control signal SBC2 of the feedback transistor switch 634. The delay circuitry block 710 provides a time buffer between the time at which memory array 632 is actively accessed and thereafter been placed in retention, such that the voltage of the bias node $V_{bias}$ of the memory array 632 is allowed to settle to retention level and thereby avoid feedback disruption of the LDO structure 605. It will be appreciated that in various embodiments, such a delay block may be similarly coupled in series with the respective control signals corresponding to one or more additional memory arrays, such as in series with the control signal SBC1 of the feedback transistor switch 624 to avoid similar LDO feedback disruption via memory array 622. The delays to different memory arrays may be staggered to facilitate avoiding disruption of the feedback loop due to bringing a larger number of arrays into retention at the same time.

Figure 8:
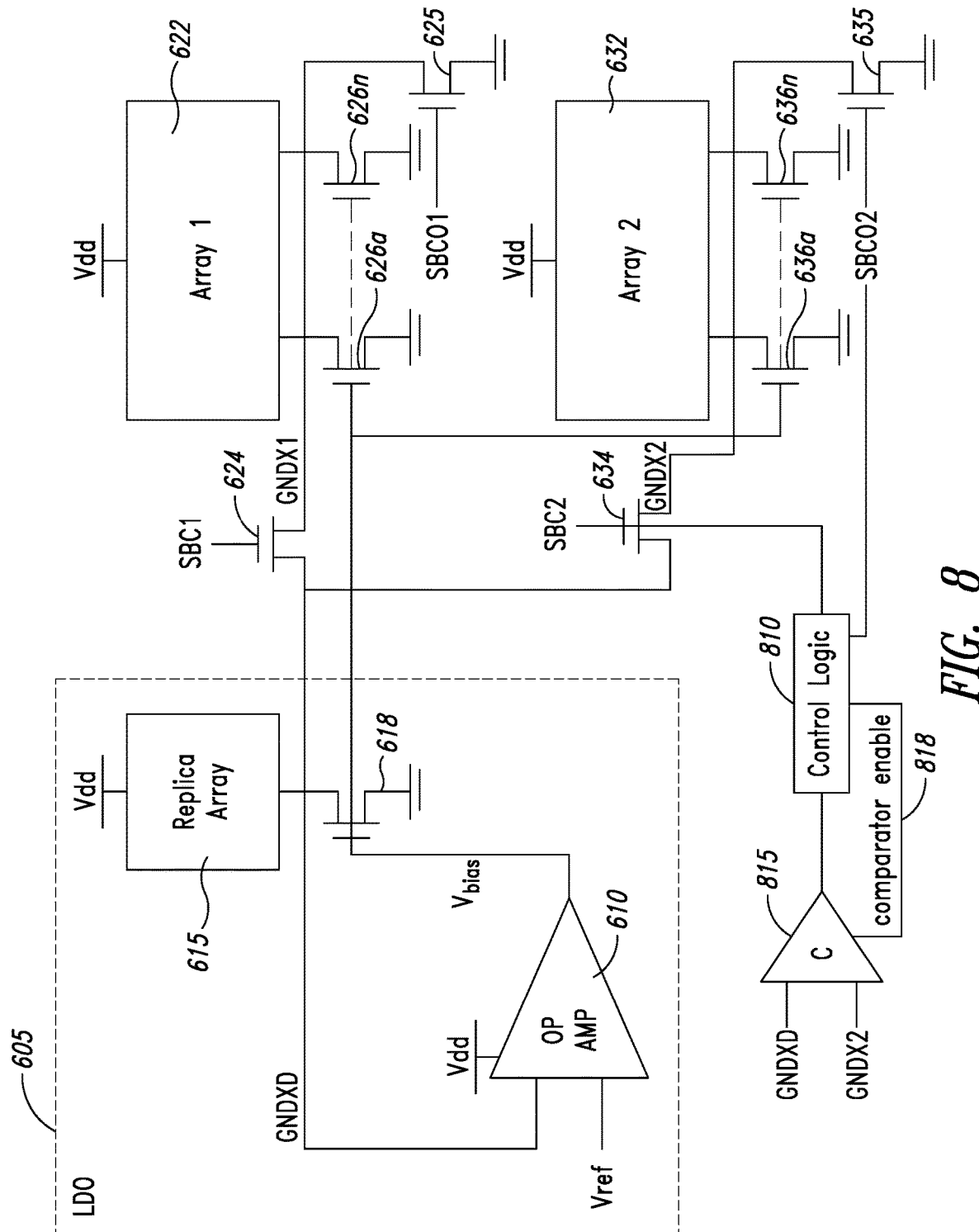
FIG. 8 illustrates an additional embodiment of a coupled plurality of disparately sized memory arrays in accordance with techniques described herein.

In an additional embodiment illustrated by FIG. 8, the embodiment of FIG. 6 has been modified to include optional control logic 810 in series with the control signal SBC2 of the feedback transistor switch 634, such as to (with respect to memory array 632) sequence the source bias control off signal SBCO2 and the source bias control SBC2. The control logic 810 is further coupled to a comparator 815 which compares the voltage level of the memory array bias node GNDX2 and the feedback voltage GNDXD of the LDO structure 605. Via comparator enable 818, control logic 810 enables the comparator 815 when the memory cell array changes from active access to retention (e.g., when SBCO2 goes low). In this and various embodiments, source bias control SBC2 is not asserted until the voltage difference between GNDXD and GNDX2 is within a threshold range. In this manner, LDO feedback disruption is reduced during the transition of memory array 632 from active access to retention.

Embodiments have been described herein as having a plurality of memory arrays of disparate sizes. However, embodiments may have a plurality of memory arrays of the same size.

Figure 9:
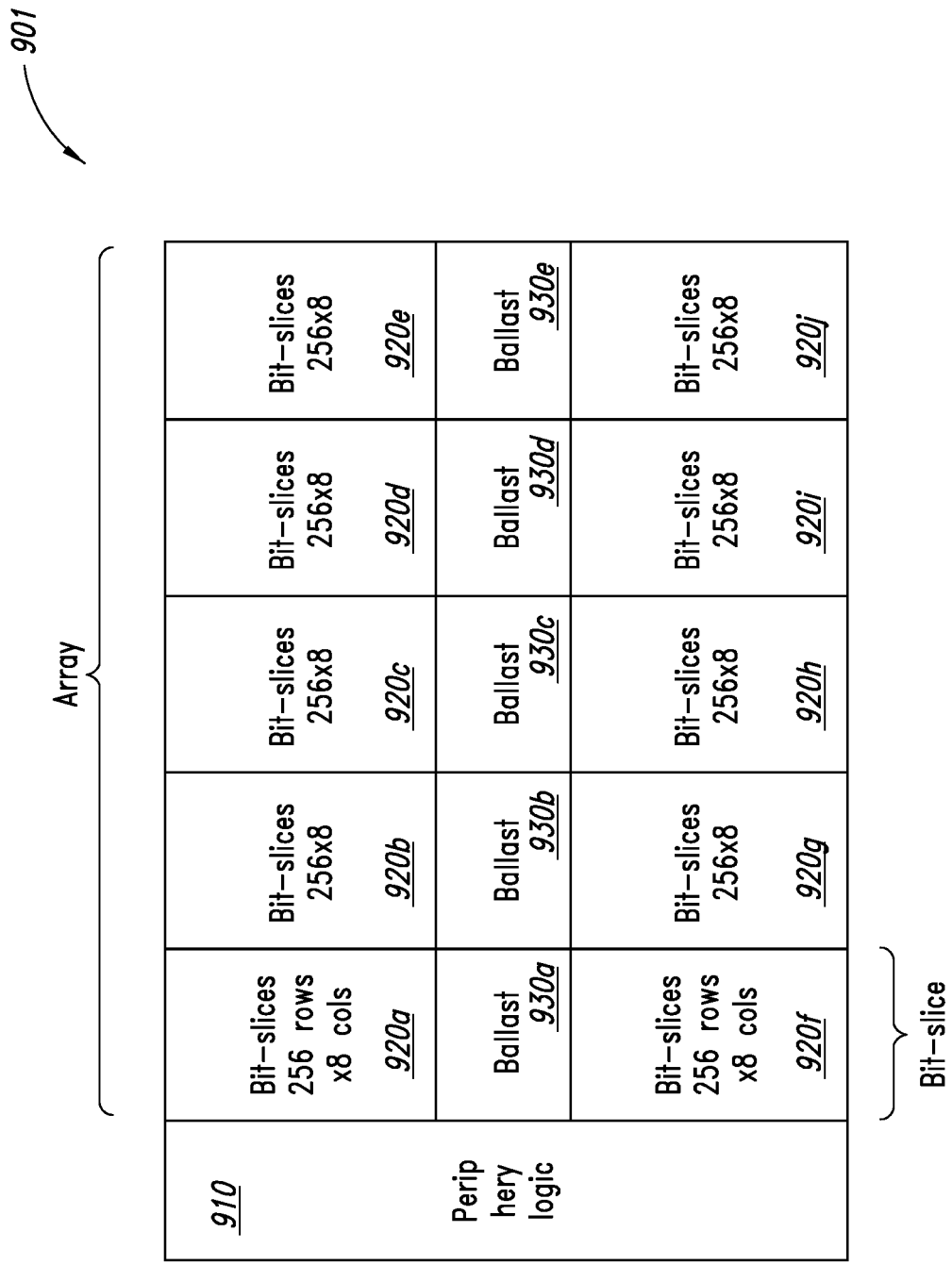
FIG. 9 depicts a block representation of an exemplary memory cell array in accordance with techniques described herein.

FIG. 9 depicts a block representation of an exemplary memory cell array 901 in accordance with techniques described herein. In particular, memory cell array 901 comprises periphery logic 910, ten individual 256 KB memory arrays (respectively identified as memory arrays 920a-j), and distributed ballast drivers 930a-e, such that ballast drivers for the memory arrays 920a-j are distributed and embedded within the memory cell array 901.

Figure 10:
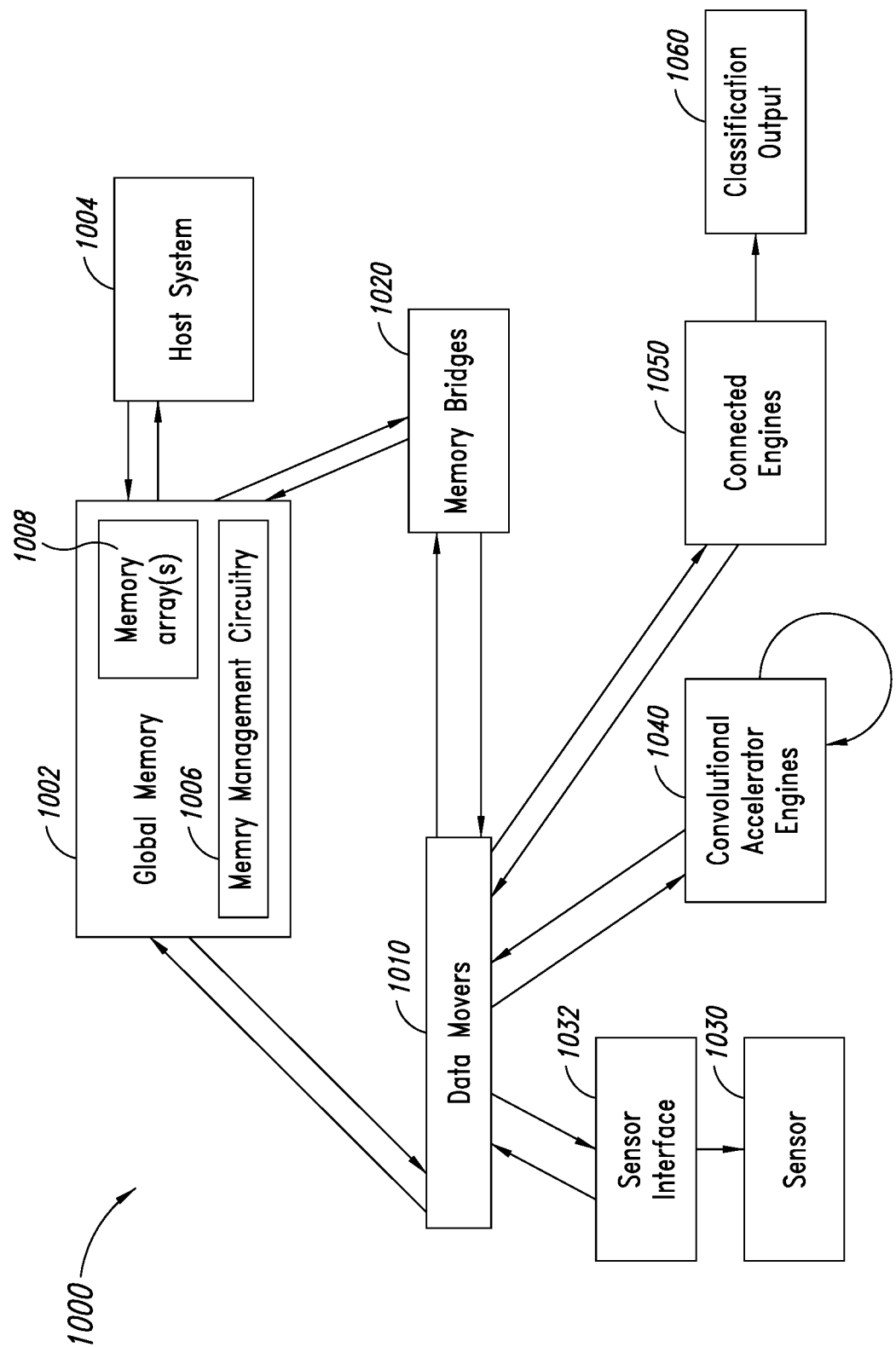
FIG. 10 is a functional block diagram of an embodiment of an electronic device or system utilizing memory array management in accordance with techniques described herein.

FIG. 10 is a functional block diagram of an exemplary electronic device or system 1000 in which various embodiments described herein may be utilized. The system 1000 may be used, for example, to implement a convolutional neural network to classify sensor data. It will be appreciated that, as such neural networks may be very memory intensive, the ability to efficiently transition portions of memory into and out of retention as needed by the neural network may provide a major improvement with respect to the power management and overall performance of such neural networks. In various implementations, the system 1000 may comprise a system on a chip.

The system 1000 comprises a global memory 1002, which may serve for example as a primary memory, such as for one or more neural network processes or processing clusters, and for one or more host system 1004 processes or processing clusters. The global memory 1002 comprises memory management circuitry 1006 and one or more shared memory arrays 1008. It will be appreciated that the memory arrays 1008 may include one or more instances of memory cell arrays in accordance with the techniques described herein, such as one or more of memory arrays 302, 310, 318 and 330 of FIGS. 3A-3B and 4-5, memory arrays 622 and 632 of FIGS. 6-8, and memory cell array 901 of FIG. 9. The memory management circuitry 1006, in operation, employs one or more memory management routines to allocate regions of the shared memory arrays 1008 to various processes executed by the system 1000.

As illustrated, the system 1000 comprises one or more data movers 1010, one or more memory bridges 1020, one or more sensors 1030 and corresponding sensor interfaces 1032, one or more convolutional accelerator engines 1040, and one or more connected engines 1050, which may be implemented and operate to produce a classification output 1060.

The data movers 1010, in operation, move data streams between IOs (e.g., sensor interfaces 1032), memory hierarchies (e.g., global memory 1002, memory bridges 1020), convolutional accelerators 1040 and connected engines 1050.

In some embodiments, the system 1000 may include more components than illustrated, may include fewer components than illustrated, may split illustrated components into separate components, may combine illustrated components, etc., and various combinations thereof.

According to at least one implementation, a system on chip (SoC) device may be summarized as including one or more processors, a memory coupled to the one or more processors and having a plurality of memory arrays, and one or more voltage regulators that are coupled to a ballast driver gate node and to a bias node of at least one of the respective memory arrays. Each respective memory array of the plurality of memory arrays may be coupled to a respective ballast driver and a respective active memory signal switch for the respective memory array.

Each of the one or more voltage regulators may be a low dropout regulator (LDO).

In operation, the respective active memory signal switch for a respective memory array may cause the respective memory array to transition between an active state for the respective memory array and a retention state for the respective memory array.

Each respective memory array of the plurality of memory arrays may be coupled to a respective voltage regulator via a respective bias node of the respective memory array, and the output of the respective voltage regulator may be coupled to a gate node of the respective ballast driver for the respective memory array.

The one or more voltage regulators coupled to the plurality of memory arrays may be a common voltage regulator having an output coupled to a respective gate node of each respective ballast driver for each memory array of the plurality of memory arrays.

The plurality of memory arrays may include a first set of memory arrays and an additional memory array. A bias node of the additional memory array may be coupled to a common bias node of the common voltage regulator and, in operation, the additional memory array may be maintained in a retention state. The additional memory array may have a size that is less than a size of any of the first set of memory arrays. A bias node of at least one memory array of the first set of memory arrays may be coupled to common bias node via a first switch; in operation, the first switch may be closed in response to an opening of the respective active memory signal switch for the at least one memory array. The SoC device may include delay circuitry coupled to the source node of the first transistor, such that in operation the delay circuitry delays the closing of the first switch in response to the opening of the respective active memory signal switch of the at least one memory array. The SoC device may include control logic coupled to the first switch and the active memory signal switch for the at least one memory array, such that in operation, the control logic closes the first switch based at least in part on a voltage at the bias node of the additional memory array being within a threshold range of a voltage at the bias node of the at least one memory array.

The plurality of memory arrays may comprise static random access memory (SRAM).

The respective ballast drivers for the plurality of memory arrays may be embedded within the plurality of memory arrays and distributed within the plurality of memory arrays.

According to at least one other implementation, a computing system may be summarized as including one or more processors, a memory coupled to the one or more processors and having a plurality of memory arrays, and one or more voltage regulators that are coupled to a ballast driver gate node and to a bias node of at least one of the respective memory arrays. Each respective memory array of the plurality of memory arrays may be coupled to a respective ballast driver and a respective active memory signal switch for the respective memory array.

Each of the one or more voltage regulators may be a low dropout regulator (LDO).

Each respective memory array of the plurality of memory arrays may be coupled to a respective voltage regulator via a respective bias node of the respective memory array, and the output of the respective voltage regulator may be coupled to a gate node of the respective ballast driver for the respective memory array.

The one or more voltage regulators coupled to the plurality of memory arrays may be a single or common voltage regulator coupled to a respective gate node of each respective ballast driver for each memory array of the plurality of memory arrays.

The plurality of memory arrays may include a first set of memory arrays and an additional memory array. A bias node of the additional memory array may be coupled to a common bias node of the common voltage regulator and, in operation, the additional memory array may be maintained in a retention state. A bias node of at least one memory array of the first set of memory arrays may be coupled to the common bias node of the common voltage regulator via a first switch; in operation, the first switch may be closed in response to an opening of the respective active memory signal switch for the at least one memory array.

According to at least one additional implementation, a memory device may be summarized as including a plurality of memory arrays and one or more voltage regulators that are coupled to a ballast driver gate node and to a bias node of at least one of the respective memory arrays. Each respective memory array of the plurality of memory arrays may be coupled to a respective ballast driver and a respective active memory signal switch for the respective memory array such that in operation, the respective active memory signal switch for a respective memory array may cause the respective memory array to transition between an active state for the respective memory array and a retention state for the respective memory array.

Each respective memory array of the plurality of memory arrays may be coupled to a respective voltage regulator via a respective bias node of the respective memory array, and the output of the respective voltage regulator may be coupled to a gate node of the respective ballast driver for the respective memory array.

The one or more voltage regulators coupled to the plurality of memory arrays may be a common voltage regulator coupled to a respective gate node of each respective ballast driver for each memory array of the plurality of memory arrays.

The plurality of memory arrays may include a first set of memory arrays and an additional memory array. A bias node of the additional memory array may be coupled to a common bias node of the common voltage regulator and, in operation, the additional memory array may be maintained in a retention state. A bias node of at least one memory array of the first set of memory arrays may be coupled to the common bias node of the common voltage regulator via a first switch, such that in operation, the first switch is closed in response to opening of the respective active memory signal switch for the at least one memory array.

According to an additional implementation, a system may be summarized as including one or more processors; a memory that is coupled to the one or more processors and has a plurality of memory arrays that includes a first set of memory arrays and an additional memory array that, in operation, is maintained in a retention state; a voltage regulator coupled to a gate node of a respective ballast driver for each memory array of the plurality of memory arrays and to a bias node of the additional memory array; a first switch coupled between a bias node of at least one memory array of the first set of memory arrays and the bias node of the additional memory array; and control logic coupled to the first switch and to the active memory signal switch for the at least one memory array. Each respective memory array of the plurality of memory arrays may be coupled to a respective ballast driver and a respective active memory signal switch for the respective memory array. In operation, the control logic may close the first switch responsive to a voltage at the bias node of the additional memory array being within a threshold range of a voltage at the bias node of the at least one memory array.

In an embodiment, a method comprises: executing one or more processes on a system on chip (SoC) having one or more processing cores and a memory, the memory having a plurality of memory arrays, wherein each respective memory array of the plurality of memory arrays is coupled to a respective ballast driver and a respective active memory signal switch for the respective memory array; and controlling, during the execution of the one or more processes, the respective active memory signal switches of the plurality of memory arrays to place the respective memories arrays in an active or a retention mode of operation. In an embodiment, the memory comprises a voltage regulator coupled to a ballast driver gate node and to a bias node of at least one of the respective memory arrays. In an embodiment, each respective memory array of the plurality of memory arrays is coupled to a respective voltage regulator via a respective bias node of the respective memory array, and the output of the respective voltage regulator is coupled to a gate node of the respective ballast driver for the respective memory array. In an embodiment, the plurality of memory arrays includes a first set of memory arrays and an additional memory array, wherein the a bias node of the additional memory array is coupled to a common bias node of a common voltage regulator, and the method comprises maintaining the additional memory array in a retention state during execution of the one or more processes. In an embodiment, the additional memory array has a size that is less than a size of any of the first set of memory arrays. In an embodiment, the method comprises selectively coupling a bias node of at least one memory array of the first set of memory arrays to the common bias node of the common voltage regulator in response to transitioning the at least one memory array into a retention state. In an embodiment, the method comprises delaying the selective coupling. In an embodiment, the method comprises coupling the bias node of the additional memory array to the bias node of the at least one memory array based on a comparison of a voltage at the bias node of the additional memory array to a voltage at the bias node of the at least one memory array.

In an embodiment, a non-transitory computer-readable medium's contents cause a computing system of a system-on-a-chip (SoC) to perform a method in accordance with one or more embodiments of the methods disclosed herein. In an embodiment, the contents include instructions, which, when executed by the SoC, cause the SoC to perform the method.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, convolutional accelerators, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system on chip (SoC) device, comprising:
one or more processing cores; and
a memory coupled to the one or more processing cores, the memory including:
  a plurality of memory circuits organized into a first set of memory circuits and a second set of memory circuits;
  a common voltage regulator having an output coupled to respective gate driver nodes of the plurality of memory circuits, wherein the common voltage regulator, in operation, regulates a voltage provided to the plurality of memory circuits; and
  memory control circuitry coupled to the plurality of memory circuits and the common voltage regulator, wherein the memory control circuitry, in operation:
    controls transitions of memory circuits of the first set of memory circuits of the plurality of memory circuits between an active state and a retention state; and
    maintains the second set of memory circuits of the plurality of memory circuits in the retention state, wherein,
  the memory control circuitry comprises a set of active memory signal switches coupled to respective memory circuits of the first set of memory circuits,
  a bias node of the second set of memory circuits is coupled to a bias node of the common voltage regulator, and
  a bias node of a memory circuit of the first set of memory circuits is coupled to the bias node of the common voltage regulator via a first switch, and, in operation, the first switch is closed in response to opening of the respective active memory signal switch for the memory circuit of the first set of memory circuits.

2. The SoC device of claim 1, comprising delay circuitry coupled to the first switch, wherein, in operation, the delay circuitry delays the closing of the first switch in response to the opening of the respective active memory signal switch for the memory circuit of the first set of memory circuits.

3. The SoC device of claim 1, wherein the common voltage regulator is a low dropout regulator (LDO).

4. The SoC device of claim 1, wherein the second set of memory circuits comprises multiple memory circuits.

5. The SoC device of claim 1, wherein the first set of memory circuits comprises multiple memory circuits.

6. The SoC device of claim 5, wherein the second set of memory circuits comprises a single memory circuit.

7. The SoC device of claim 1, wherein a size of a memory circuit of the first set of memory circuits is larger than a size of a memory circuit of the second set of memory circuits.

8. The SoC device of claim 1, comprising:
a second memory coupled to the one or more processing cores.

9. The SoC device of claim 8, wherein the second memory comprises:
a second plurality of memory circuits organized into a third set of memory circuits and a fourth set of memory circuits;
a second common voltage regulator having an output coupled to respective gate driver nodes of the second plurality of memory circuits, wherein the second common voltage regulator, in operation, regulates a voltage provided to the second plurality of memory circuits; and
second memory control circuitry coupled to the second plurality of memory circuits and the second common voltage regulator, wherein the second memory control circuitry, in operation:
  controls transitions of the third set of memory circuits of the second plurality of memory circuits between the active state and the retention state; and
  maintains the fourth set of memory circuits of the second plurality of memory circuits in the retention state.

10. The SoC device of claim 9, wherein a memory circuit of the second plurality of memory circuits comprises a memory array.

11. The SoC device of claim 1, wherein, the one or more processing cores, in operation, implement a neural network using the memory, the implementing the neural network including generating signals to cause the memory control circuitry to selectively transition memory circuits of the first set of memory circuits between the active state and the retention state.

12. A memory, comprising:

a plurality of memory circuits organized into a first set of memory circuits and a second set of memory circuits;

a common voltage regulator having an output coupled to respective gate driver nodes of the plurality of memory circuits, wherein the common voltage regulator, in operation, regulates a voltage provided to the plurality of memory circuits; and memory control circuitry coupled to the plurality of memory circuits and the common voltage regulator, wherein the memory control circuitry, in operation:

controls transitions of the first set of memory circuits of the plurality of memory circuits between an active state and a retention state; and maintains the second set of memory circuits of the plurality of memory circuits in the retention state, wherein, the memory control circuitry comprises a set of active memory signal switches coupled to respective memory circuits of the first set of memory circuits, a bias node of the second set of memory circuits is coupled to a bias node of the common voltage regulator, and a bias node of a memory circuit of the first set of memory circuits is coupled to the bias node of the common voltage regulator via a first switch, and, in operation, the first switch is closed in response to opening of the respective active memory signal switch for the memory circuit of the first set of memory circuits.

13. The memory of claim 12, comprising delay circuitry coupled to the first switch, wherein, in operation, the delay circuitry delays the closing of the first switch in response to the opening of the respective active memory signal switch for the memory circuit of the first set of memory circuits.

14. The memory of claim 12, wherein the second set of second memory circuits comprises a single memory circuit having a size smaller than a size of a memory circuit of the first set of memory circuits.

* * * * *